(12) United States Patent
Hermans et al.

(10) Patent No.: US 8,872,295 B2
(45) Date of Patent: Oct. 28, 2014

(54) THIN FILM PHOTOVOLTAIC DEVICE WITH ENHANCED LIGHT TRAPPING SCHEME

(75) Inventors: Ko Hermans, Nederweert (NL); Benjamin Slager, Rhenen (NL); Bart Clemens Kranz, Reek (NL); Andreas Hofmann, Rostock (DE)

(73) Assignees: DSM IP Assets B.V., Heerlen (NL); Schüco TF GmbH & Co., KG, Bielefeld (DE)

( * ) Notice: Subject to any disclaimer, the term of this patent is extended or adjusted under 35 U.S.C. 154(b) by 0 days.

(21) Appl. No.: 13/638,768

(22) PCT Filed: Mar. 31, 2011

(86) PCT No.: PCT/EP2011/054998
§ 371 (c)(1),
(2), (4) Date: Oct. 1, 2012

(87) PCT Pub. No.: WO2011/121067
PCT Pub. Date: Oct. 6, 2011

(65) Prior Publication Data
US 2013/0026593 A1    Jan. 31, 2013

(30) Foreign Application Priority Data

Mar. 31, 2010 (EP) ................................... 10158760

(51) Int. Cl.
| | | |
|---|---|---|
| *H01L 31/0236* | (2006.01) | |
| *H01L 31/0224* | (2006.01) | |
| *H01L 31/048* | (2014.01) | |
| *H01L 27/142* | (2014.01) | |

(52) U.S. Cl.
CPC .......... *H01L 31/0236* (2013.01); *H01L 31/048* (2013.01); *H01L 27/1423* (2013.01); *Y02E 10/50* (2013.01)

USPC ............ 257/432; 257/436; 257/466; 136/256

(58) Field of Classification Search
CPC ..................... H01L 31/0236; H01L 31/02327; H01L 31/0527; H01L 31/022466; H01L 31/022475; H01L 31/022483; H01L 31/02366
USPC ......................................... 257/432, 436, 466
See application file for complete search history.

(56) References Cited

U.S. PATENT DOCUMENTS

| 6,538,195 B1 | 3/2003 | Shi et al. |
| 2001/0017153 A1 | 8/2001 | Kubota et al. |

(Continued)

FOREIGN PATENT DOCUMENTS

| EP | 0 991 129 A1 | 4/2000 |
| EP | 2 157 622 A2 | 2/2010 |
| WO | WO 2009/059998 A1 | 5/2009 |

OTHER PUBLICATIONS

J. Müller et al., "TCO and light trapping in silicon thin film solar cells," Solar Energy, vol. 77, Issue 6, Dec. 2004, pp. 917-930.

(Continued)

*Primary Examiner* — Matthew W Such
*Assistant Examiner* — Scott Stowe
(74) *Attorney, Agent, or Firm* — Nixon & Vanderhye P.C.

(57) ABSTRACT

A thin film photovoltaic device comprising a relief textured transparent cover plate, a layer of transparent conductive oxide having a layer thickness of less than 700 nm, a light absorbing active layer and a reflective back electrode, where the layer of transparent conductive oxide is a non-textured layer.

9 Claims, 2 Drawing Sheets

(56) References Cited

U.S. PATENT DOCUMENTS

| | | |
|---|---|---|
| 2002/0129850 A1 | 9/2002 | Nomura |
| 2008/0115828 A1 | 5/2008 | Taylor |
| 2008/0308151 A1* | 12/2008 | Den Boer et al. ............. 136/256 |
| 2009/0165850 A1* | 7/2009 | Saita et al. .................... 136/256 |
| 2009/0194150 A1 | 8/2009 | Aoki |

OTHER PUBLICATIONS

C. Haase et al., "Efficient light trapping scheme by periodic and quasi-random light trapping structures," Photovoltaics Specialists Conference, 2008.

C. Haase et al., "Light trapping in thin-film silicon solar cells with periodic structures," Proc. $21^{st}$ European Photovoltaic Solar Energy Conference and Exhibition, Dresden, Germany, 2006, pp. 1509-1512.

International Search Report issued in International Application No. PCT/EP2011/054998 dated Jun. 4, 2012.

Written Opinion of the International Searching Authority issued in International Application No. PCT/EP2011/054998 dated Jun. 4, 2012.

Oct. 2, 2012 International Preliminary Report on Patentability cited in International Application No. PCT/EP2011/054998 filed Mar. 31, 2011.

\* cited by examiner

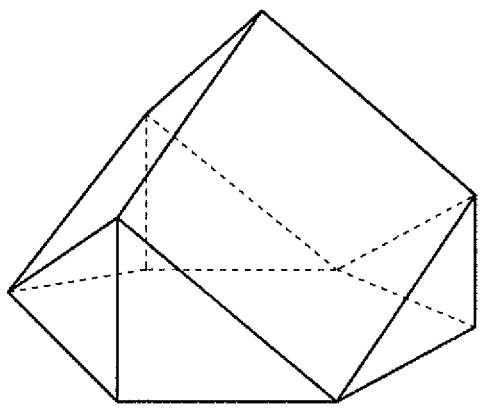
FIG. 4A
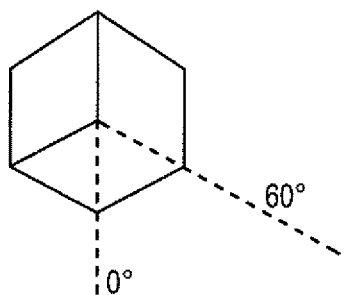
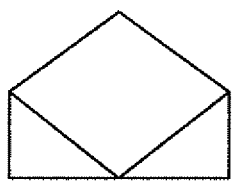
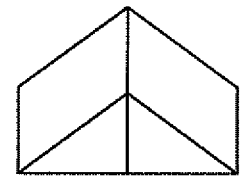
FIG. 4B      FIG. 4C      FIG. 4D
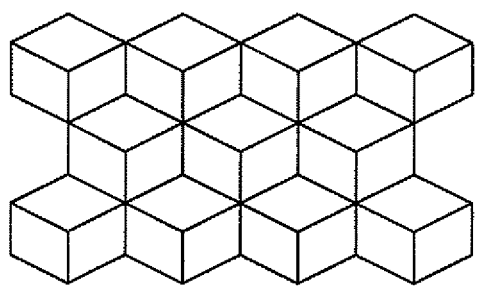
FIG. 4E

THIN FILM PHOTOVOLTAIC DEVICE WITH ENHANCED LIGHT TRAPPING SCHEME

This application is the U.S. national phase of International Application No. PCT/EP2011/054998 filed Mar. 31, 2011 which designated the U.S. and claims priority to EP 10158760.8 filed Mar. 31, 2010.

BACKGROUND

Photovoltaic devices are commonly used to convert light energy into electrical energy. These devices contain an active layer which is of a light absorbing material that generates charge carriers upon exposure to light. A typical example of such a material is mono- (m-Si) and poly- (p-Si) silicon. Since silicone is expensive, it is important to keep the layer thickness to a minimum. In the case of m-Si and p-Si, the layer thickness is relatively thick because the material is also used as a substrate for creating the photovoltaic device. The total layer thickness of the silicon is therefore around 180 μm. To overcome this and other problems thin film photovoltaic devices were developed. Said devices use another material (e.g. glass, plastic or metal foil) as a substrate and only a thin layer (±0.1-4 μm) of the active material is applied to this substrate. Examples of light absorbing materials which are used in thin photovoltaic applications are amorphous silicon (a-Si), microcrystalline silicon (μc-Si), copper indium gallium selenide (CIGS), cadmium telluride (CdTe) and dye-sensitized solar cell (DSC).

A light absorbing material does not absorb all wavelength of light equally efficient. The percentage of photons at a given wavelength that generate charge carriers is called the quantum efficiency (QE). Each light absorbing material has a different QE. In some cases therefore several layers of different light absorbing materials are applied on top of each other to absorb as much light as possible. For example a combination of two light absorbing materials may be used of which one has a high QE in the blue/green region of the light spectrum and another the other one the peen/red region of the light spectrum. By doing so a broader range of wavelengths is effectively absorbed and converted into charge carriers. Atypical example is using a combination of a-Si and μc-Si.

A thin film photovoltaic device contains, besides the active layer, several other components. For example it is necessary to collect the charge carvers that are created when light is absorbed by the active layer. Hereto electrodes are placed on the front (light receiving side) and back (non-light receiving side) of said active layer. Especially the front side TCO is required to have a high conductivity (sheet resistance typically 8-14 Ohm/square) while also showing a high transmittance. Otherwise the active layer would not receive any light and would thus not be able to generate charge carriers. Usually a transparent conductive oxide (TCO) is used for this purpose. Examples of TCO materials are indium tin oxide (ITO), fluorinated tin oxide (FTO) or (aluminum) zinc oxide (AZO). The back electrode is often based on a highly reflective material such as silver. The reason for this is that light which is not absorbed by the active layer is reflected back into the active layer by the reflective electrode. Hence, the path length of the incident light is increased and thus also the chance of absorption. For the purpose of increasing the path length of light it is also possible to use a transparent back electrode with a separate reflective layer (such as a white foil) behind it. In any case, the stack of thin films is very thin and can be easily damaged. To protect them, a transparent cover made of glass or polymers is used on the front side (i.e. the light receiving side). The back can be protected by both transparent or non-transparent materials such as glass, tedlar epoxy resin etc. The back and front cover is often laminated together by using ethylene vinyl acetate (EVA), ionomers, thermoplastic polyurethanes (TPU) or polyvinylbutyral (PVB).

Thin film modules are manufactured by depositing the thin layers (i.e. electrodes and active layer) via techniques as chemical or physical vapor deposition on a substrate. In principle various materials can act as a substrate, however, commonly the protective cover plate is used for this purpose. For example if one starts with a glass cover plate first the TCO is applied, next the a-Si layer and the silver electrode are deposited and finally the back is sealed by a protective polymeric coating.

For thin film applications it is very important to keep the layer thickness as thin as possible, but without loss of efficiency of the device. A thinner layer results in less material costs and faster processing. On the other hand, it is important that the layer is thick enough to absorb most of the incoming light. Light which is not absorbed cannot be converted into electrical energy which results in a poor efficiency of the photovoltaic device. In the prior art several methods are known to overcome this problem.

A common method to reduce the layer thickness of the active material is to create a texture, which refracts light, into the front electrode or TCO. As a result of the refraction of light the path length of the light into the active material is increased. The relief texture can be a random texture (J. Müiler et al., TCO and light trapping in silicon thin film solar cells, Solar Energy, Vol 77, Issue 6, December 2004 (917-930)). Control over the refraction of light is however limited and the increase in path length is therefore small. It is also possible to create a periodic texture (C. Haase et al., Efficient light trapping scheme by periodic and quasi-random light trapping structures, Photovoltaics Specialists Conference, 2008) into the TCO. A periodic texture can better control the refraction of light, however the manufacturing is expensive since multiple complicated processing steps are required. An alternative method is to make a texture which diffracts light, such as a grating, into the TCO (C. Haase, H. Stiebig, Light trapping in thin-film silicon solar cells with periodic structures, Proc. 21st European Photovoltaic Solar Energy Conference and Exhibition, Dresden, Germany, 2006, p.1712). Such elements are capable of redirecting light quite effectively, however, only for a specific (range of) wavelength. Regardless of the type of texture, there are several disadvantages of using the concept of a textured TCO. Texturing introduces defects into the TCO which causes absorption of free carriers and thus loss of efficiency of the photovoltaic device. In addition a TCO is not fully transparent and does absorb some of the incident light. To texture a TCO it is necessary to use a thicker layer of TCO material, which does result in more absorption of light. Consequently less light can reach the light absorbing active layer and can thus be converted into charge carriers. This also reduces the efficiency of a thin film photovoltaic device.

Since it is not always possible to directly texture the TCO, it is also possible to indirectly texture the TCO by texturing the substrate on which the TCO is applied. For example the glass front cover can be textured before applying the TCO (U.S. Pat. No. 6,538,195B1). By subsequently depositing the TCO on the textured glass, the texture of the glass is also present in the TCO. Regardless of the method and way of texturing the principle disadvantages are similar to the once discussed in the previous paragraph. In addition the textured glass is not compatible with the laser patterning processes through the glass.

In some cases a thin film photovoltaic device is manufactured by depositing the reflective back electrode, light absorbing active layer and the TCO on a substrate which is used at the back cover rather than the (glass) front cover. For these devices it is, analogous to the above-discussed possibilities, possible to texture the reflective back electrode or the substrate on which the reflective back electrode is deposited (U.S. 2009/194150 A1). Also this method of texturing suffers from the already discussed disadvantages.

EP 0 991 129 A1 describes a photovoltaic module comprising a textured glass cover plate. The texture renders anti-glaring properties to the cover plate. Furthermore, the document proposes the use of an index-matching agent for enabling a laser patterning of the thin films from the light incident side through the glass by optically compensating the effect of the front texture. EP 0 991 129 A1 mentions the TCO properties in example 1 as $SnO_2$, film thickness of 700 nm and a peak-to-peak roughness of 200 nm.

U.S. 2002/129850 A1 proposes the use of an anti-glare layer, preferably made of an organic binder material containing light scattering particles. Both the composition of the layer and the surface roughness are responsible for the layer's anti-glaring properties. Since such a layer can be applied to a finished photovoltaic module, such a layer can be applied after laser patterning, thus solving the compatibility problem of having a light scattering cover and the requirement of laser scribing through the front cover U.S. 2008/115828 proposes the use of textured cover glass comprising non-textured edges in order to render it compatible with the state of the art encapsulation process of framed modules. U.S. 2008/115828 mentions ZnO or $SnO_2$ as transparent conductive materials suitable for photovoltaic modules. The textured layer renders anti-reflective properties to the plate.

From the above it can be concluded that methods to increase the path length of light into the active material of a thin film photovoltaic device are either non-effective or involve high manufacturing costs. It could be said that in essence the problem here is that non-optical elements (i.e. electrodes) are used as optical components for enhancing the path length of light into the light-absorbing layer. It is therefore an objective to overcome these problems.

SUMMARY

Embodiments of the invention include a thin film photovoltaic device, comprising a relief textured transparent cover plate, a layer of transparent conductive oxide (TCO) having a layer thickness of less than 700 nm, a light absorbing active layer and a reflective back electrode, wherein the layer of transparent conductive oxide is a non-textured layer.

DETAILED DESCRIPTION OF EMBODIMENTS

Embodiments of the present invention have several advantages. One of these aspects is that normally the TCO is textured to increase the path lengths of light (and thus the absorption of light) into the absorber layer. The TCO is therefore designed for a specific texture, high conductivity and low absorption. This is making the process costly and hard to control. For example a typical TCO is made by forming a 800-1200 nm thick non-textured TCO layer and etch it in a wet-chemical processes to form a textured 600-800 nm TCO of desired optical and electrical properties. An embodiment of the invention only requires a material of good conductivity and low absorption. Since the resulting texture after wet processing is dependent on the size of the crystallites, which is a function of the film thickness, films can be grown much thinner saving deposition time and possibly also enabling deposition at substrate temperatures which are not as demanding as the ones that are currently used, for ZnO up to 400° C.

Another advantage is, that requirements of having a uniform texture over large substrate sizes (generally 8.5 up to the glass industries standard) and the dependence of texture and substrate temperature are very hard to realize process wise. Resulting non-uniformities in the texture would lead to a non-uniform External Quantum Efficiency (EQE) of the plurality of cells formed on such a TCO substrate with the cell of the lowest resulting short circuit current limiting the large area device.

If for example one would compare the costs of 600-800 nm textured ZnO to non-textured 100-400 nm ZnO the costs are significantly less. In addition there are energy savings, since no additional etching process and less process control for generating a "uniform randomly textured" layer are required.

A non-textured TCO would also have the advantage of reducing or eliminating the problem of short-circuiting an a-Si cell due to TCO grains contacting p- and n-layers. The relief textured transparent cover plate is designed such that light (e.g. sunlight) is at least partially transmitted upon incidence to the relief texture and at least partially reflected upon incidence from the opposite side (e.g. light reflected by the reflective back electrode). As a result the light transmitted through the relief textured cover plate into a photovoltaic device according to an embodiment is at least partially trapped between the reflective back electrode and the relief textured cover plate. Due to this trapping the path length of light in the light absorbing active layer is increased and thus the layer thickness can be kept to a minimum. Besides the reduction costs and faster processing, a thinner light absorbing active layer also results in less degradation. Alternatively the increased path length is used to create a more efficient device. It is surprisingly found that the trapping effect of the relief texture cover plate is most efficient for specular reflection and far less effective for diffuse reflection A textured TCO would cause the reflection from reflective back electrode (or other reflections from e.g. the TCO itself) to become diffuse rather than specular. Hence the use of a non-textured TCO is required for efficient trapping. Additionally the use of a flat TCO allows the TCO to be thin which results in less absorption of light in the TCO. A high transmittance of the non-textured TCO-layer is important to minimize the absorption since the goal behind the creation of such a light confining structure is to increase absorption in the photoactive layers. Also the absence of a surface texture reduces the absorption of free charge carriers by the TCO.

A non-textured layer could have with a sheet resistance of <20 Ohm/square and preferably a sheet resistance of <10 Ohm/square.

The surface roughness of the non-textured layer could be preferably similar to the underlying (glass) substrate.

Although the relief texture on the transparent cover could contain only one individual geometrical optical relief structure it is preferred that the transparent cover contains an array of geometrical optical relief structures. An array is to be understood as a collection or group of elements, in this case individual optical relief structures, placed adjacent to each other or arranged in rows and columns on one substrate. Preferably the array contains at least 4 geometrical optical relief structures.

In a preferred embodiment, the cover plate contains an array of geometrical optical relief structures with adjacent structures abutting each other. The structures can be placed such that the orientation of all structures is the same, alternating or random with respect to each other.

An individual geometrical optical relief structure is characterized in that it contains a base, an apex and a set of surfaces which connect the base to the apex. The apex is defined as the upper part of an individual structure to which the set of surfaces, which are connected to the base, combines. An apex can be a point (e.g. as encountered in a pyramid or cone), a small area (e.g. flat topped pyramid or cone) or a line (e.g. as encountered in a groove). Examples of geometrical optical structures are pyramids, v-shaped grooves or a saw tooth profile. In a preferred embodiment the relief texture is characterized in that a single structure comprises a base and an apex which are connected by at least three n-polygonal surfaces where n is equal to 4 or higher. The preferred optical relief structures are in described in detail in WO 2009/059998.

When describing the base of an individual optical relief structure by a circle where the edges of the base lie on the circumferential line of the circle, the diameter D of the circle is preferably less than 30 mm, more preferably less than 10 mm and most preferably less than 3 mm.

The height of structures depends on the diameter D of the base and is preferably between 0.1*D and 2*D.

In a preferred embodiment the light receiving side of the transparent cover plate is relief textured.

The relief textured transparent cover plate can be made of glass or polymeric materials. In a preferred embodiment the relief textured is made of polymeric material. Examples of polymeric materials are acrylics such as polymethylmethacrylate (PMMA), polycarbonate (PC), polyurethanes (PU) and fluoropolymers such as polyvinylidenefluoride (PVDF), polytetrafluoroethylene (PTFE), polyvinylfluoride (PVF), Perfluoroalkoxy (PFA), Fluorinated ethylene propylene (FEP), or Ethylene tetrafluoroethylene (ETFE). In another preferred embodiment the relief textured transparent cover plate is made in a polymeric material and subsequently applied to a flat glass carrier plate. For example the relief textured cover plate can be made of an acrylic polymer. Said cover plate is subsequently applied by lamination to the glass front cover plate of solar module. The glass front cover plate of the solar module acts in this case as the carrier plate.

The TCO can be of any material which is at least partially transparent and electrically conductive. Examples of materials are indium tin oxide (ITO), fluorinated tin oxide (FTO), doped zinc oxides such as aluminum zinc oxide (AZO), organic films containing graphene or carbon nanotube networks or polymeric materials such as poly(3,4 ethylenedioxythiophene) (PEDOT) and its derivatives.

The layer thickness of the TCO is preferably less than 650 nm, more preferably less than 600 nm, even more preferably less than 500 nm and most preferably less than 100 nm, e.g. 50 nm.

A non-textured TCO is preferably as any TCO without a texture, which has the purpose of controlling light, The light absorbing active layer can be of any material which is capable of converting absorbed photons into charge carriers (electron-hole pairs). Examples of these materials are amorphous silicon (a-Si), microcrystalline silicon (μc-Si), copper indium gallium selenide (CIGS), cadmium telluride (CdTe) and dye-sensitized solar cell (DSC).

The reflective back electrode can be made of any material, which is at least partially reflective and electrically conductive. Examples of the materials are silver or aluminum. The reflective back electrode is preferably flat, but may also contain some texture.

In an alternative embodiment, the layer thickness of the active material in the photovoltaic device can be reduced due to the effective trapping of light into said active layer by the relief textured transparent cover plate. The reduction in layer thickness is relative to the same photovoltaic device without the textured transparent cover plate. This reduction is at least at least 10%, but preferably more than 20% and most preferably more than 30%. The reduction in layer thickness of the active material can also be achieved in case the TCO is textured, however a non-textured TCO will result in far better trapping and thus a surprisingly high performance of the photovoltaic device.

Embodiments of the invention may best be understood by reference to the following drawings and examples. The following figures and examples are intended to describe certain embodiments of the present invention and should not be interpreted in any manner as limiting the scope of embodiments as set forth in the accompanying claims. An embodiment is further elucidated by the following example(s):

EXAMPLES

Example 1

A polymeric sheet is created which contains an array of structures as described in FIG. 4. A thin film silicon module is made which is based on a tandem junction cell structure of two light absorbing active layers and where the upper cell consists of amorphous silicon and the bottom cell consists of microcrystalline silicon. The TCO in the module is based on a non-textured 50 nm thick layer of aluminum-doped zinc oxide. Silver is used as a reflective back electrode. The polymeric sheet is applied to the glass front cover of the thin film silicon module by lamination with a sheet of EVA.

Example 2

A polymeric sheet is created which contains an array of structures as described in FIG. 4. A thin film silicon module is made which is based on a tandem junction cell structure of two light absorbing active layers and where the upper cell consists of amorphous silicon and the bottom cell consists of microcrystalline silicon. The TCO in the module is based on a non-textured 50 nm thick layer of aluminum-doped zinc oxide. Silver is used as a reflective back electrode. The polymeric sheet is applied to glass front cover of the thin film silicon module by a silicone-based adhesive.

Example 3

A polymeric sheet is created which contains an array of structures as described in FIG. 4. A thin film silicon module is made which is based on -Si/μc-Si based photovoltaic modules comprising a textured cover plate, a non-textured 100-400 nm ZnO, a 150-200 nm a-Si i-layer, a 500-800 nm μc-Si i-layer. Silver is used as a reflective back electrode. The polymeric sheet is applied to glass front cover of the thin film silicon module by using a polymeric adhesive.

BRIEF DESCRIPTION OF DRAWINGS

Figure 1:
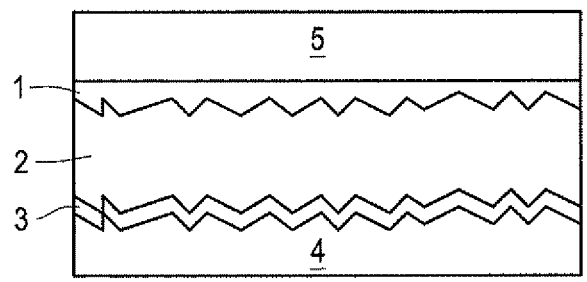

Brief description of the drawings:

FIG. 1 schematically shows a method for reducing the thickness of an active material.

Figure 2:
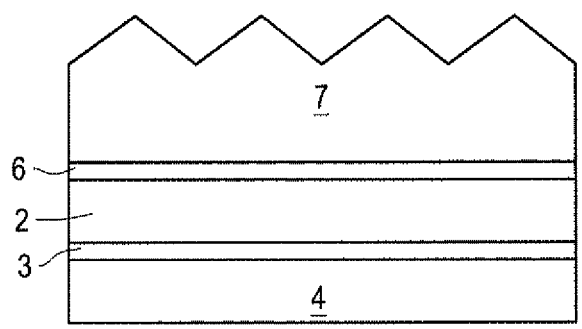
Figure 3:
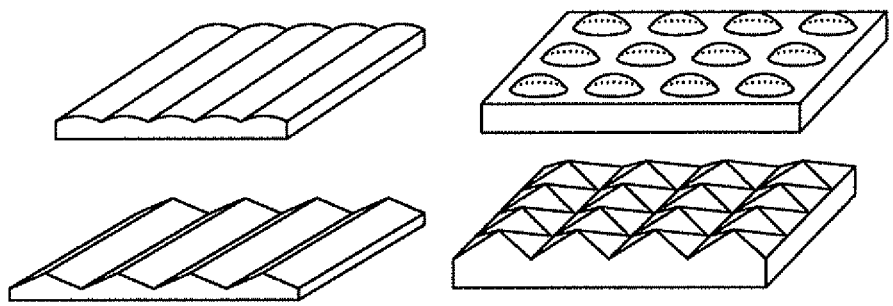

FIG. 2 schematically shows a photovoltaic device comprising a relief textured transparent cover plate, a non-textured TCO, a light absorbing active layer and a reflective back electrode FIG. 3 schematically shows a selection of different geometrical optical relief structures.

FIG. 4A-E schematically shows a single structure in different views and an array of this structure.

FIG. 1:

FIG. 1 schematically shows a method according to the prior art to reduce the layer thickness of the active material or active layer 2. This is to create a texture, which refracts light, into the front electrode or TCO 1. As a result of the refraction of light the path length of the light into the active material 2 is increased. Control over the refraction of light is however limited and the increase in path length is therefore small. Also, texturing introduces defects into the TCO 1, which causes absorption of free carriers and thus loss of efficiency of the photovoltaic device. In addition a TCO 1 is not fully transparent and does absorb some of the incident light. To texture a TCO 1 it is necessary to use a thicker layer of TCO material 1, which does result in more absorption of light. Consequently less light can reach the light absorbing active layer 2 and can thus be converted into charge carriers. This also reduces the efficiency of a thin film photovoltaic device. On top of the randomly textured TCO 1 a transparent cover 5 is provided. A reflective back electrode 3 build up a protective back layer 4.

FIG. 2:

FIG. 2 schematically shows an embodiment, where a thin film photovoltaic device is displayed that it comprises a relief textured transparent cover plate 7, a non-textured TCO 6, a light absorbing active layer 2 and a reflective back electrode 3. The relief textured transparent cover plate 7 is designed such that light (e.g. sunlight) is at least partially transmitted upon incidence to the relief texture and at least partially reflected upon incidence from the opposite side (e.g. light reflected by the reflective back electrode). As a result the light incident to a photovoltaic device according to an embodiment is at least partially trapped between the reflective back electrode 3 and the surface texture. Due to this trapping the path length of light in the light absorbing active layer is increased and thus the layer thickness can be kept to a minimum. Alternatively the increased path length is used to create a more efficient device. Additionally the use of a flat TCO 6 (i.e. a textured TCO) allows the TCO 6 to be thin which results in less absorption of light in the TCO 6. Also the absence of a surface texture reduces the absorption of free charge carriers by the TCO 6.

FIG. 3:

FIG. 3 schematically shows some preferred individual geometrical optical relief structures containing a base, an apex and a set of surfaces that connect the base to the apex. The apex is defined as the upper part of an individual structure to which the set surfaces that are connected to the base combine. An apex can be a point (e.g. as encountered in a pyramid or cone), a small area (e.g. flat topped pyramid or cone) or a line (e.g. as encountered in a groove). These are several examples of relief structures according to embodiments.

FIG. 4:

FIG. 4 schematically shows further embodiments of the relief texture. Here, a single structure comprises a base and an apex which are connected by at least three n-polygonal surfaces where n is equal to 4 or higher. In FIG. 4A a 3D view of the structure with three 4-polygonal surfaces connecting the base and the apex is shown. In FIG. 4B a top view of the structure of FIG. 4A is shown. In FIG. 4C a side view along a 0° axis and in FIG. 4D a side view along 60° axis of this structure is shown. FIG. 4E shows an array of the structure of FIG. 4A.

The invention claimed is:

1. A thin film photovoltaic device comprising:
   a relief textured transparent cover plate,
   a front electrode consisting of a single layer of transparent conductive oxide having a layer thickness of less than 700 nm,
   a light absorbing active layer, and
   a reflective back electrode, wherein
   the layer of transparent conductive oxide is a non-textured layer, and wherein the transparent cover plate is relief structured by comprising an array of geometrical optical relief structures containing a base, an apex and a set of surfaces, wherein the surfaces connect the base to the apex, and the surfaces are at least three n-polygonal surfaces where n is equal to 4 or higher.

2. The device of claim 1, wherein the reflective back electrode is non-textured.

3. The device according to claim 1, wherein the light receiving side of the transparent cover plate is relief textured.

4. The device according to claim 1, wherein the transparent cover plate is made of a polymeric material.

5. The device according to claim 1, wherein the relief textured cover plate is applied to a glass plate.

6. The device according to claim 1, wherein the layer of transparent conductive oxide is made of aluminum doped zinc oxide.

7. The device according to claim 1, wherein the reflective back electrode is made of silver.

8. The device according to claim 1, wherein the light absorbing active layer comprises several different layers of absorbing material.

9. The device according to claim 8, wherein the light absorbing active layer comprises a layer of amorphous silicon and a layer of microcrystalline silicon.

\* \* \* \* \*